United States Patent [19]
Dammel et al.

[11] Patent Number: 6,042,992
[45] Date of Patent: Mar. 28, 2000

[54] BOTTOM ANTIREFLECTIVE COATINGS THROUGH REFRACTIVE INDEX MODIFICATION BY ANOMALOUS DISPERSION

[75] Inventors: Ralph R. Dammel, Flemington; Robert N. Norwood, Cranford, both of N.J.

[73] Assignee: Clariant Finance (BVI) Limited, Virgin Islands (Br.)

[21] Appl. No.: 08/811,806

[22] Filed: Mar. 6, 1997

Related U.S. Application Data

[60] Provisional application No. 60/013,009, Mar. 7, 1996.

[51] Int. Cl.⁷ .................................................. G03F 7/00
[52] U.S. Cl. .......................................... 430/290; 430/325
[58] Field of Search .................................. 430/290, 330, 430/325

[56] References Cited

U.S. PATENT DOCUMENTS

| | | | |
|---|---|---|---|
| 4,491,628 | 1/1985 | Ito et al. | 430/176 |
| 4,631,328 | 12/1986 | Ringsdorf et al. | 526/259 |
| 5,069,997 | 12/1991 | Schwalm et al. | 430/270 |
| 5,207,952 | 5/1993 | Griffin, III | 252/582 |
| 5,227,444 | 7/1993 | Muller et al. | 526/311 |
| 5,350,660 | 9/1994 | Urano et al. | 430/176 |
| 5,384,378 | 1/1995 | Etzbach et al. | 526/256 |
| 5,472,827 | 12/1995 | Ogawa et al. | 430/315 |
| 5,496,899 | 3/1996 | Foll et al. | 525/327 |
| 5,525,457 | 6/1996 | Nemoto et al. | 430/325 |
| 5,554,489 | 9/1996 | Ishibashi et al. | 430/326 |
| 5,580,700 | 12/1996 | Rahman | 430/330 |
| 5,652,297 | 7/1997 | McCulloch et al. | 524/555 |
| 5,652,317 | 7/1997 | McCulloch et al. | 526/312 |
| 5,656,128 | 8/1997 | Hashimoto et al. | 216/47 |
| 5,674,356 | 10/1997 | Nagayama | 430/316 |

FOREIGN PATENT DOCUMENTS

| | | |
|---|---|---|
| 522990 | 1/1993 | European Pat. Off. . |
| 583205 | 2/1994 | European Pat. Off. . |
| 4311761 | 10/1993 | Germany . |
| 7-153682 | 6/1995 | Japan . |
| WO 95/10798 | 4/1995 | WIPO . |
| WO 97/33200 | 9/1997 | WIPO . |

OTHER PUBLICATIONS

JP appln 6–128916 (Kokai 7–333855), Mitsubishi Chemical, Nishi et al., Dec. 22, 1995, trans. of claims.

Dijkstra, Optimization of AR layers for deep UV lithography, Optical/Laser Micorlithography, SPIE proceedings, vol. 1927, pp. 282–283, Mar. 1993.

SPIE vol. 1466, Advances in Resist Technology and Processing VIII (1991) pp. 297–307, T. Brunner "Optimization of Optical Properties of Resist Processes".

Patent Abstracts of Japan, vol. 96, #5, Mar. 31, 1996, & JP 08 017711, Sony Corp., Jan. 19, 1996.

Patent Abstracts of Japan, vol. 12, #489(E–696), Dec. 21, 1988, & JP 63 202915, Oki Electric Ind. Co. Ltd., Aug. 22, 1988.

Patent Abstracts of Japan, vol. 7, #136(E–181), Jun. 14, 1983, & JP 58 051515, Fujitsu KK), Mar. 26, 1983.

SPIE vol. 1927, Optical/Laser Microlithography, Mar. 3, 1993, pp. 275–286, "Optimization of Anti–reflection Layers for Deep UV Lithography", H. J. Dijkstra et al.

SPIE vol. 2724, Advances in Resist Technology and Processing XIII, Mar. 11, 1996, pp. 754–769, "Modeling of Bottom Anti–reflection Layers: Sensitivity to Optical Constants Photolithography", R. R. Dammel et al.

1046 Journal of the Electrochemical Society 137(1990)Dec., No. 12, "A New Photolithography Technique with Antireflective Coating on Resist: ARCOR", T. Tanaka et al.

SPIE vol. 1674 Optical/Laser Microlithography V (1992), pp. 147–156, "Reduction of Linewidth Variation Reflective Topography", S. S. Miura et al.

8226 Microelectronic Engineerng 25(1994)May, No. 1, pp. 21–34, "On the processing of i–line positive resists with a top anti–reflective coating", Alexander et al.

*Primary Examiner*—Kathleen Duda
*Attorney, Agent, or Firm*—Sangya Jain

[57] ABSTRACT

The invention provides a process for the generation of an antireflective bottom layer with effective reduction of substrate reflectivity and swing curve effects in lithographic applications. It involves the use of a suitably selected monomeric and/or polymeric dye which brings the real part of the refractive index into a range which is optimal for the suppression of reflection-related effects. The refractive index change is effected via anomalous dispersion, i.e., by utilizing changes in the real part of the refractive index caused by the bottom layer's absorption.

6 Claims, 3 Drawing Sheets

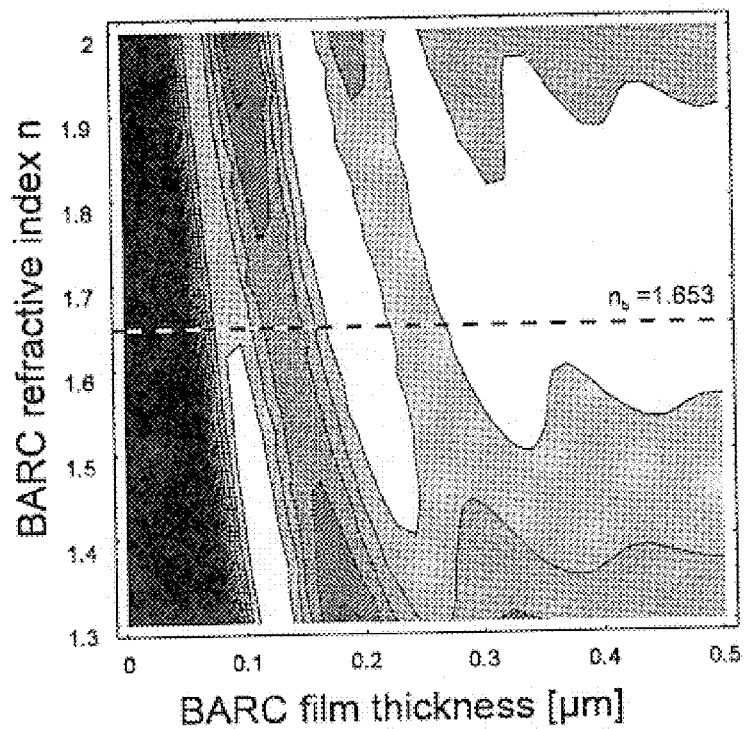

Figure 1: Contour plot of the bottom coat reflectivity vs. the real part of the BARC's refractive index and vs. BARC thickness. Lighter sections correspond to lower reflectivity, starting with R < 0.05 for the lightest one, and rising in increments of 0.05 thereafter. The dotted line corresponds to a possible compromise between the optimality conditions for low and high film thickness.

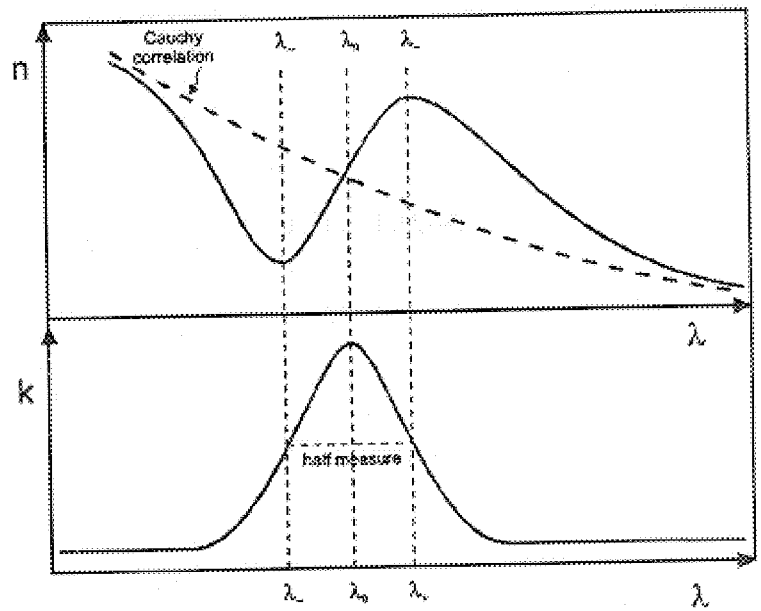

Figure 2: Principle of anomalous dispersion

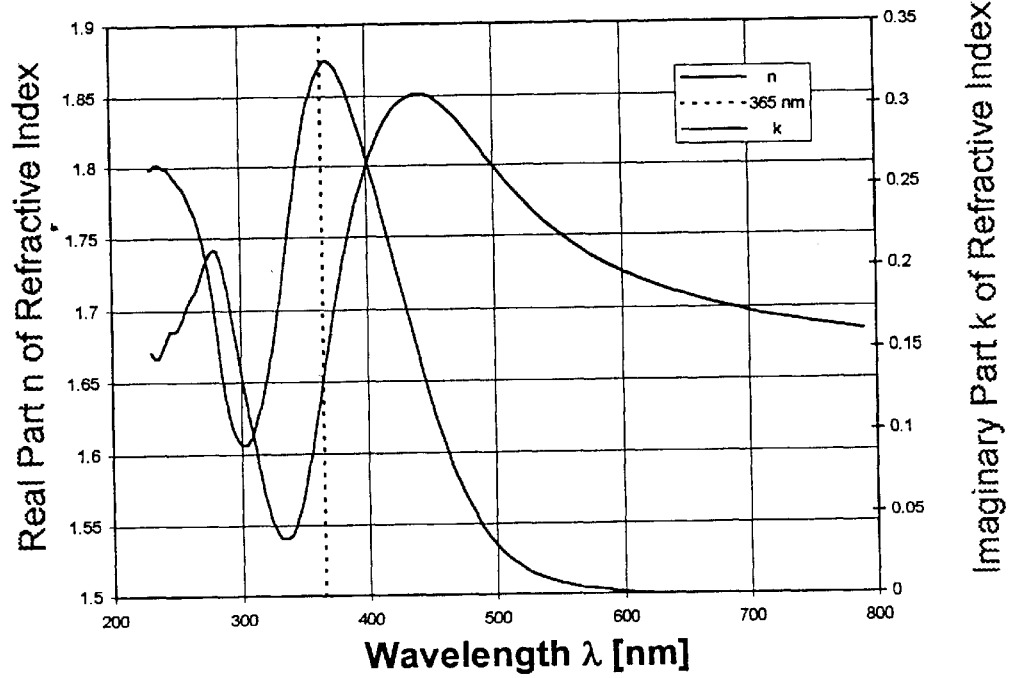
Figure 3: Dispersion curves showing anomalous dispersion effect for AZ®BARLi™ bottom coat, as measured by spectroscopic ellipsometry.
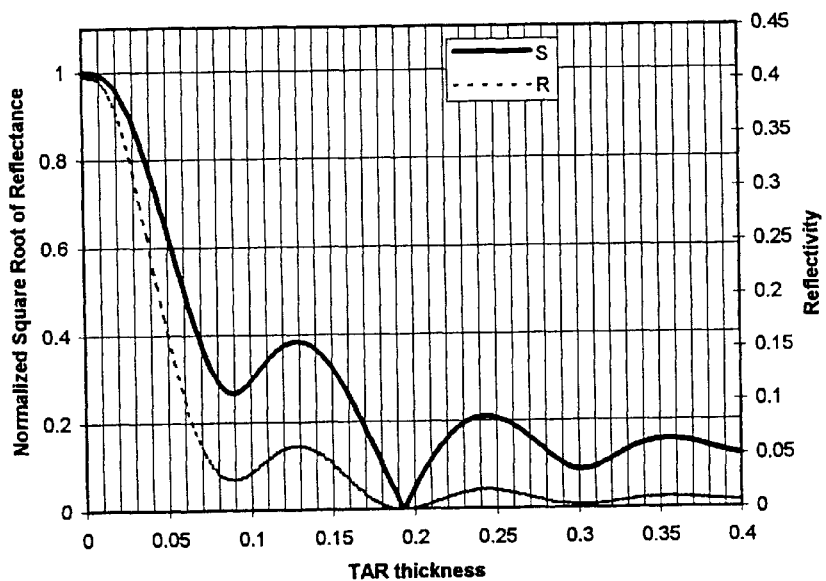
Figure 4: Swing ratio and reflectivity for n = 1.65 and k = 0.30. Silicon substrate, photoresist refractive index $N_r$ = 1.704 - 0.024.

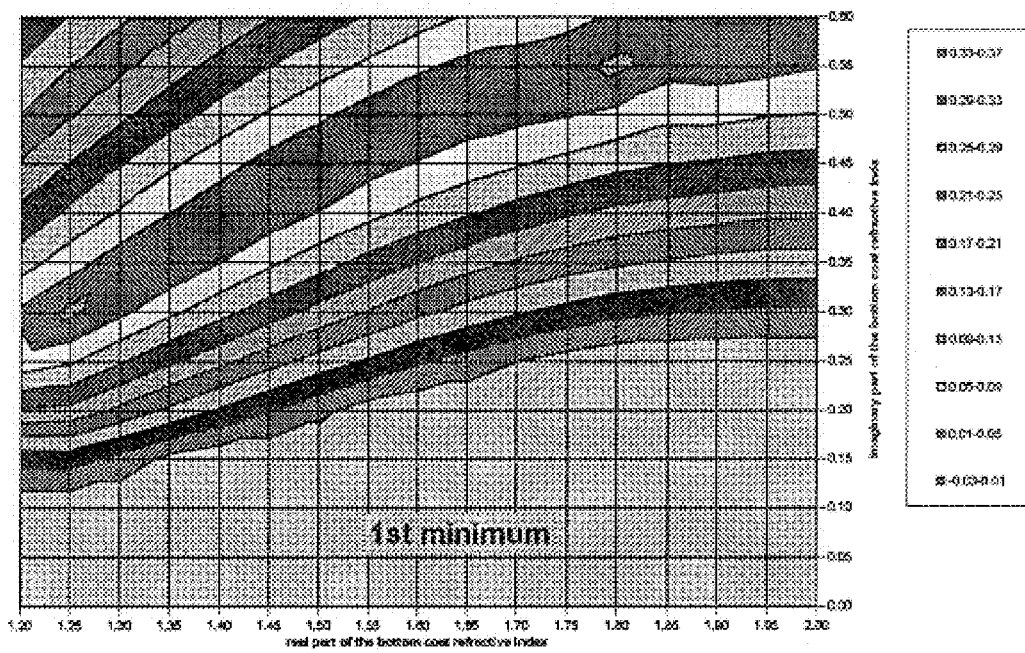
Figure 5: Contour plot of swing ratio values for the first minimum as a function of bottom coat optical constants. Illumination wavelength 365 nm, $N_r = 1.7161 - 0.025i$.
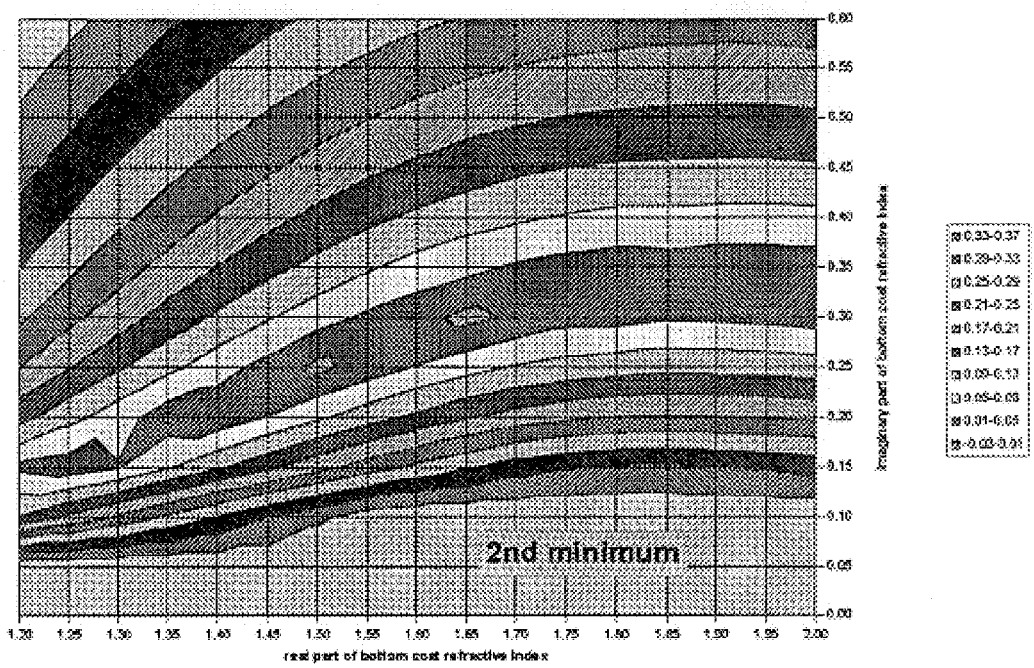
Figure 6: Contour plot of swing ratio values for the second minimum as a function of bottom coat optical constants. Illumination wavelength 365 nm, $N_r = 1.7161 - 0.025i$.

BOTTOM ANTIREFLECTIVE COATINGS THROUGH REFRACTIVE INDEX MODIFICATION BY ANOMALOUS DISPERSION

This application claims the benefit of U.S. Provisional application No.: 60/013,009: Filing date Mar. 7, 1996.

BACKGROUND OF THE INVENTION

Bottom antireflective coatings (B.A.R.C.'s) are used in microlithography to reduce the effects of the periodic variation of photoresist sensitivity with film thickness (the so-called swing curve) and to remove or reduce the effect of reflections off non-planar substrates. A well-known phenomenon is the dimensional variation of lines going over steps: reflection of light by the non-vertical sidewalls of the step causes increased incoupling of energy into the resist volume adjacent to the step, leading to a reduction in linewidth ("reflective notching"). Similar effects may be observed on reflective materials with a particularly coarse-grained structure.

It has been shown in the literature (T. Brunner, Proc. SPIE 1466, 297 (1991)) that the amplitude of the swing curve, defined as the so-called "swing ratio" S, may be approximated by $$S = 4(R_r R_b)^{1/2} \exp(-\alpha\, d) \tag{1}$$

where $R_r$ is the reflectance at the top of the resist layer, e.g. to air or to a top antireflective layer, $R_b$ is the one at the bottom, e.g., to the substrate or to a bottom antireflective layer, and d is the resist film thickness.

In the following, we will be writing the resist refractive index as a complex number $N_r = n_r - ik_r$, where $n_r$ is the real part of $N_r$, and is equivalent to what is commonly called "the refractive index", $k_r$, the imaginary part of $N_r$, is often referred to as the extinction coefficient. It is related to the absorption coefficient as a function of wavelength, $\alpha_r(\lambda)$, by $k_r = \alpha_r \lambda/(4\pi)$.

the substrate/bottom coat/resist/air film stack can in good approximation be treated as a three layer system in which a thin bottom antireflective cost is sandwiched between semi-infinite resist and substrate layers. In this case, the amplitude of reflection off the BARC is given by $$\rho_b = (\rho_{rb} + \rho_{bs}\pi^2)/(1 + \rho_{rb}\rho_{bs}\pi^2), \tag{2}$$

where $\rho_{rb} = (N_r - N_b)/(N_r + N_b)$, $\rho_{bs} = (N_b - N_b)/N_b + N_s)$ are reflection coefficients, $\pi^2 = \exp(-i\, 4\pi/\lambda N_b\, t)$ is the phase factor, t is the bottom antireflector film thickness, and the subscripts r,b, and s denote resist, bottom coat, and substrate, respectively. For absorbing films, $\rho_b$ is a complex number. The reflectance off the bottom coat is given by $R = \rho_b \rho_b^*$, where the star denotes taking the complex conjugate.

It follows from the above that, very much like a photoresists, bottom antireflective coatings are subject to interference effects which cause a periodic variation in the intensity of the reflected light with increasing thickness of the layer. Since a bottom ARC is much more absorbing than a photoresist, the bottom ARC "swing curve" is, however, severely damped. All reflection transmission factors and the phase coefficient are complex numbers. The calculation therefore quickly becomes rather messy and yields quite cumbersome expressions; we have chosen to carry it out with the symbolic algebra package of the Mathematical program (copyright Wolfram Technologies, Inc.), or with a Microsoft® Excel™ spreadsheet written using the complex number handling provided by the Excel™ analysis toolpack. When interpreting the reflectance values of FIG. 1, it should be kept in mind that the swing ratios are proportional to the square root of the reflectance, not to the reflectance itself.

Analysis results indicate that for low values of the bottom coat extinction coefficient $k_b$, the reflectance does not reach near-zero values in the first interference minima; however, it reaches very low values for very thick bottom coats. In contrast, for high $k_b$, the first minimum already comes close to zero reflectance, but the reflectance for thicker films is so high that subsequent minima have higher reflectance, and the asymptotic reflectance for very thick films is much higher. Basically, this means that very absorbing thick bottom coats start to act as mirror elements of their own; essentially in the same way that metals are good mirrors precisely because they are so highly absorbing.

By considering the continuity conditions for the electric and magnetic field amplitudes in Maxwell's equations at the boundaries of semi-infinite resist and bottom coat layers, it is possible to derive an equation for the reflectance at infinite film thickness:

$$R_\infty = \frac{(n_r - n_b)^2 + (k_r - k_b)^2}{(n_r + n_b)^2 + (k_r + k_b)^2}, \tag{3}$$

where the subscript r denotes the refractive index components of the resist, and b those of the bottom coat. As can be easily ascertained by inserting typical values of resist and bottom coat real and imaginary refractive indices, for practically encountered values of the optical constants the major contribution to the reflectance at infinite film thickness comes from the mismatch in the imaginary parts, not the real parts. Since a bottom coat needs to be absorbing, this mismatch in the imaginary parts is unavoidable and inherent in the concept of a bottom coat. In a nutshell, the above treatment therefore indicates that for every intended film thickness, there is an optimum extinction. Thin antireflective layers will have to be very absorbing, while thick layers should be designed with lower absorptivities.

For the real part of the refractive index, eq. (3) thus indicates that, for high values of the BARC film thickness, the reflectivity is minimal in the case of a perfect match of resist and bottom coat refractive indices ($n_r = n_b$). This is confirmed by a contour plot of the reflectivity R at the resist/bottom coat interface vs $n_b$ and the bottom coat thickness t (FIG. 1). A resist refractive index of $n_r = 1.7$ was used in the calculation; other optical parameters were: $k_r = 0.04$, $k_b = 0.334$, $n_s = 5.0$, $k_s = 0.25$, $\lambda = 365$ nm (exposure wavelength). For the commonly used diazonaphthoquinone/novolak g- and i-line materials frequently encountered values of $n_r$ are 1.64 to 1.69 at 435 nm, and 1.66 to 1.72 at 365 nm.

It is seen by inspection of FIG. 1 that the minima are lined up along the $n_r = 1.7$ line for larger B.A.R.C. thicknesses. For smaller film thicknesses, especially for the region of the first interference minimum, it would be advantageous to have lower resist refractive indices. It is, however, possible to choose a B.A.R.C. refractive index which works well at both thin and thick B.A.R.C. films. One such possible line has been drawn in FIG. 1 at $n_b = 1.653$.

It has been shown above that the optimum B.A.R.C. refractive index for higher film thickness is equal to the resist refractive index, and that for lower thicknesses, it is possible to find workable compromises which allow one to use a B.A.R.C. with a refractive index slightly lower than the resist refractive index for both low and high film thicknesses. What has not been shown is how to achieve the index match condition. This will be shown in this invention.

SUMMARY OF THE INVENTION

The present invention covers a process for forming an image on a substrate, comprising forming an antireflective film on a substrate, where the antireflective film has a real part of refractive index optically matched to a real part of refractive index of a photoresist film coated on top of the antireflective film, followed by forming a photoresist film on top of the antireflective film, imagewise exposing the photoresist, developing to form an image, and optionally baking prior to or after developing.

DESCRIPTION OF THE INVENTION

Dispersion relations for the real part of the refractive index, such as Cauchy's equation, fail for wavelengths in or close to a region of strong absorbance. The reason for this is the phenomenon of anomalous dispersion, in which the real part of the refractive index is influenced by the imaginary part. A schematic of anomalous dispersion is shown in FIG. 2. As can be seen, in the wavelength region below the absorbance maximum, the refractive index shows a decrease, the size of which is correlated to the strength of the absorption.

The relation between the real and the imaginary part of the refractive index $k_b = \alpha \lambda/(4\pi)$ is given via the dielectric constant $\epsilon = \epsilon' - i\epsilon'' = n^{-2} = n^2 - k^2 - 2i\,n\,k$ by a special Hilbert transform called a Kramers-Kronic relation:

$$\varepsilon'(\omega) - 1 = \frac{2}{\pi} P \int_0^\infty d\omega' \frac{\varepsilon''(\omega')\omega'}{\omega'^2 - \omega^2} \quad (4)$$

$$\varepsilon''(\omega) = -\frac{2\omega}{\pi} P \int_0^\infty d\omega' \frac{\varepsilon'(\omega') - 1}{\omega'^2 - \omega^2}$$

where $\omega = c/(2\pi\lambda)$, and where P denotes that the principal part of the integral is to be taken.

However, practical application of the relations (4) may be very cumbersome since in principle one has to know the absorption spectrum over the entire electromagnetic spectrum, although it is possible to develop equations based on oscillator models which allow one to predict the behavior of n and k. In practice, it is usually found for reasonably symmetrical absorption bands that at the absorption maximum, the anomalous dispersion contribution is approximately zero, that the local maximum occurs just before the half height of the absorption band on the long wavelength side, and the local minimum just after the half height on the low wavelength side. These positions have been indicated as $\lambda_{max}$, $\lambda_+$ and $\lambda_-$ in FIG. 2.

By a judicious choice of the right dye, it is thus possible to select the absorption maximum and half width of the absorption band in such a way that the real part of the refractive index is strongly raised or depressed at a target wavelength, e.g., the lithographically important mercury i- or g-line bands at 365 and 435 nm, or the KrF and ArF excimer laser wavelengths at 248 and 193 nm. It is thus possible to reduce the reflectivity of the bottom coat by selecting the refractive index at $n_r = n_b$ or slightly below, if one desires a material which is both useful at low and high B.A.R.C. thickness.

In principle, nearly any value of the real part of the refractive index can be reached by using anomalous dispersion: it may be raised above 40 or even lowered below the value of 1 for extremely absorbing substances (e.g., for cadmium sulfide around 250 cm$^{-1}$). In practice, for organic dyes in the region of interest (450–180 nm), it is difficult to reach absorption values above $\alpha = 20\,\mu\text{m}^{-1}$, or k values above 0.6 to 0.7. If the additional constraint is added that the material must be film forming, typically only about a maximum of 60–70% of the material's mass will consist of an active dye, whether polymerically bound or in the form of an admixture of a dye to a film forming material. This means that for practical purposes, typical $\alpha$ values will be limited to a maximum of 12 to 14 $\mu\text{m}^{-1}$. For example, a commercial antireflective bottom layer, AZ®BARLi™ coating has an absorption of $\alpha = 11.5\,\mu\text{m}^{-1}$ at 365 nm, corresponding to a $k_b$ value of 0.334. A measurement of the dispersion curve of AZ®BARLi™ coating by spectroscopic ellipsometry showed that the total change of the real part of the refractive index $n(\lambda_+) - n(\lambda_-)$ (cf. FIG. 3) was about 0.32, resulting in a refractive index of 1.653 at i-line. In comparison, the extrapolation of the Cauchy correlation to the i-line wavelength predicted a value of 1.9.

It should be pointed out that, in the process of selecting the dye, one should take into account that in the environment of the solid bottom antireflective coating the absorption of the dye may be shifted substantially by solvatochromic, pH dependent or other shifts. It is therefore important to carry out the adjust based on data generated in the actual film, not in a liquid phase UV spectrum.

BRIEF DESCRIPTION OF THE DRAWINGS

FIG. 1 is a contour plot of the bottom coat reflectivity vs. the real part of the B.A.R.C.'s refractive index and vs. B.A.R.C. thickness. Lighter sections correspond to lower reflectivity, starting with R<0.05 for the lightest one, and rising in increments of 0.05 thereafter. The dotted line corresponds to a possible compromise between the optimality conditions for low and high film thickness.

FIG. 2 illustrates the principle of anomalous dispersion.

FIG. 3 has dispersion curves showing anomalous dispersion effect for AZ®BARLi™ bottom coat, as measured by spectroscopic ellipsometry.

FIG. 4 shows the swing ratio and reflectivity for n=1.65 and k=0.30 for a silicon substrate and a photoresist with refractive index $N_r = 1.704 - 0.024i$.

FIG. 5 is a contour plot of swing ratio values for the first minimum as a function of bottom coat optical constants. Illumination wavelength 365 nm, $N_r = 1.7161 - 0.025i$.

FIG. 6 is a contour plot of swing ratio values for the second minimum as a function of bottom coat optical constants. Illumination wavelength 365 nm, $N_r = 1.7161 - 0.025i$.

The following specific example will provide a detailed illustration of using the present invention. This example is not intended, however, to limit or restrict the scope of the invention in any way and should not be construed as providing conditions, parameters of values which must be utilized exclusively in order to practice the present invention.

EXAMPLE

Determination of Optimality Conditions for Antireflective Bottom Coatings for a Wavelength of 365 nm The optical lithograph simulation program PROLITH Version 4.05 (a product of Finle Corporation, Austin, Tex.) was used to calculate the reflectivity off a bottom coat into a photoresist. For the photoresist, optical constants of n=1.7161 and k=0.025 were assumed; these constants are typical for i-line photoresist materials. The reflectivity R was calculated as a function of three variables, the bottom coat thickness t in the range of zero to 350 nm in steps of 5 nm, and of the real and imaginary parts of the bottom coat refractive index $n_b$ and $k_b$, between the values of 1.2 and 2.0 for n and 0 and 0.6 for k, both in steps of 0.05. This calculation resulted in a table of approx. 71×13×17=15,691 data points $R(t,n_b,k_b)$, which were imported into a Microsoft Excel™ spreadsheet. The swing ratio S relative to that of the resist on silicon was determined by taking the square root of the reflectivity, divided by the square root of the reflectivity for zero bottom coat film thickness. These relative swing ratio values were then organized into a pivot table, a spreadsheet feature which allows for organizing the data by grouping all values of R for the value of, e.g., $n_b$=1.65, yielding a two-dimensional table of $R(t,1.65,k_b)$. This table can be visualized as a family of curves or as a contour plot. Choosing another value of $n_b$ in the table's drop-down menu causes the information relating to that value to be displayed. Alternatively, the data may be organized by k-values, resulting in a family of tables $R(t,n_b 0$ to 0.6). From these representations, it is possible to obtain, for any set of bottom coat optical constants, the optimum film thicknesses at which the swing ratio is minimized. For the case of $n_b$=1.65 and $k_b$=0.30, one such curve is shown in FIG. 4, showing that optimum operating points exist at 88, 193 and around 300 nm (first, second and third minimum).

From the information in the pivot table, it is now possible to generate a representation of the swing ratio as a function of the bottom coat optical constants by tabling the value of S in one of the minima as a function of n and k, while choosing the thickness t such as to reach the lowest $S=S_{min}$ for that minimum. One thus obtains tables for, e.g., the minimum swing ration $S_{min}$ in the first minimum, or that in the second minimum, both as a function of $n_b$ and $k_b$ alone.

From the table for the first minimum, one can see that there is a band of preferred optical constants for which the swing ratio can be brought to below 5%. Within this band, there are two most preferred operating points in which the swing ratio is below 1%, which are $N_b$=1.25−0.30i ($S_{min}$=0.48%) and $N_b$=1.8−0.55i ($S_{min}$=0.56%) (FIG. 5).

The above treatment can be repeated for the second minimum, which again results in a band of preferred optical constants, the position of which is, however, different from that obtained for the first minimum (FIG. 6). Again there are two points for which the swing ratio is below 1%, $N_b$=1.50−0.25i($S_{min}$=0.05%) and $N_b$=1.65−0.30i($S_{min}$=0.14%).

As can bee seen, a value of $n_b$=1.65 allows one to use the antireflective coating effectively in the first and second minima, while maintaining low reflectivity (cf. eq. 2) with higher bottom coat thickness. Such higher thickness may be used to planarize high topography on semiconductor devices, or they may occur in deep trenches on such devices even when using lower overall coated film thickness. As disclosed above, such a value of the real part of the refractive index can be obtained by careful selection of the position and width of the bottom coating's absorption bands.

What is claimed is:

1. A process for forming on a substrate an antireflective film and a photoresist film sensitive to an exposure wavelength, comprising:
   a) forming an antireflective film on a substrate, where the antireflective film comprises an absorbing organic compound, further where the antireflective film has a real part of refractive index within 0.1 of a real part of refractive index of a photoresist film coated on top of the antireflective film, further where the absorbing compound in the antireflective film is chosen in such a way that the absorption maximum of the absorbing compound is less than the exposure wavelength for the photoresist and where the exposure wavelength is between the absorption maximum and half height of the absorption band of the absorbing compound, resulting in an anomalous dispersion contribution to the refractive index of the antireflective film that raises the refractive index; and
   b) forming the photoresist film on top of the antireflective film.

2. A process for forming on a substrate an antireflective film and a photoresist film sensitive to an exposure wavelength, comprising:
   a) forming an antireflective film on a substrate, where the antireflective film comprises an absorbing organic compound, further where the antireflective film has a real part of refractive index within 0.1 of a real part of refractive index of a photoresist film coated on top of the antireflective film, further where the absorbing compound is chosen in such a way that the absorption maximum of the absorbing compound is greater than the exposure wavelength and where the exposure wavelength is between the absorption maximum and half height of the absorption band of the absorbing compound, resulting in an anomalous dispersion contribution to the refractive index of the antireflective film that lowers the refractive index; and
   b) forming the photoresist film on top of the antireflective film.

3. The process of claims 1 or 2, wherein the photoresist film comprises a diazonaphthoquinone photoactive compound and a novolak resin, and wherein the real part of the refractive index of the antireflective film is in the range of about 1.6 to about 1.8 for an exposure wavelength of about 365 nm.

4. The process of claims 1 or 2, wherein the photoresist film comprises a diazonaphthoquinone photoactive compound and a novolak resin, and wherein the real part of the refractive index of the antireflective film is in the range of about 1.55 to about 1.75 for an exposure wavelength of about 435 nm.

5. The process of claims 1 or 2, wherein the real part of the refractive index of the antireflective film is in the range of about 1.6 to about 1.8 for an exposure wavelength of about 365 nm.

6. The process of claims 1 or 2, where the exposure wavelength is in a range of 180 nm to 450 nm.

* * * * *